United States Patent [19]

Kojima et al.

[11] Patent Number: 5,446,722
[45] Date of Patent: Aug. 29, 1995

[54] INFORMATION RECORDING APPARATUS HAVING MAGNETIC SHIELD MEANS

[75] Inventors: Yoshiaki Kojima; Yasumitsu Wada; Masahiro Katsumura, all of Tsurugashima, Japan

[73] Assignee: Pioneer Electronic Corporation, Tokyo, Japan

[21] Appl. No.: 132,958

[22] Filed: Oct. 7, 1993

[30] Foreign Application Priority Data

Oct. 14, 1992 [JP] Japan .................................. 4-276068

[51] Int. Cl.6 ............................................. G11B 19/20
[52] U.S. Cl. ........................................ 369/266; 369/264; 360/97.02
[58] Field of Search .............. 369/126, 264, 266, 77.2; 365/53, 118; 360/97.02, 97.03, 97.04

[56] References Cited

U.S. PATENT DOCUMENTS

| | | | |
|---|---|---|---|
| 3,943,275 | 3/1976 | Jebens et al. | 369/213 |
| 4,074,313 | 2/1978 | Reisner et al. | 369/44.39 |
| 4,731,778 | 3/1988 | van Hout et al. | 369/266 |
| 4,945,515 | 7/1990 | Ooumi et al. | 365/174 |
| 5,335,217 | 8/1994 | Kaneda et al. | 369/77.2 |

Primary Examiner—Joseph A. Popek
Assistant Examiner—Andrew Q. Tran
Attorney, Agent, or Firm—Keck, Mahin & Cate

[57] ABSTRACT

An information recording apparatus including a device for driving an optical-disk's master disk, an electron lens barrel for having an electron beam irradiate a recording surface of a disk, a translational device for producing, between the disk and the electron lens barrel, a relative movement in a direction parallel to the recording surface and a container for enclosing the elements of the apparatus adapted to support a vacuum atmosphere. The driving device includes a turn table 4, a spindle 14a for supporting the turn table, a motor 14 for driving the spindle, and a magnetic shield for preventing magnetic fields of the motor from leaking outward. The motor is enclosed in the shield to prevent its magnetic fields from affecting the electron beam, which makes it possible to record information with high accuracy. The use of the motor as a drive source realizes easier and more responsive control of the turn table than that in the prior art.

5 Claims, 3 Drawing Sheets

INFORMATION RECORDING APPARATUS HAVING MAGNETIC SHIELD MEANS

BACKGROUND OF THE INVENTION

1. Field of the Invention

The present invention relates to an information recording apparatus for producing a master medium of an information recording medium for replicas such as optical disks (i.e., compact disks, laser disks and the like).

2. Description of the Prior Art

The conventional art relate to the production of a conventional master disk for producing the information recording medium. Through a lens barrel of a scanning electron microscope, an electron beam directly irradiates a principal surface of a master disk while the disk rotates. At the same time, the master disk is moved in a direction parallel to its principal surface so that a spiral pattern of the thus irradiated spots (i.e., recorded pits) is formed on the surface of the master disk.

Now, the lens barrel 1 for irradiating the electron beam will be described in construction with reference to FIG. 1. As shown in FIG. 1, electrons emitted from a filament 1a energized with a high voltage of approximately 10 kV pass through a Wehnelt electrode 1b and an anode 1c to become an electron beam. The beam then passes through a first electromagnetic lens 1d and a second electromagnetic lens 1e while the beam is converged therethrough. The thus converged beam reaches a deflection electrode if through which the electron beam is focused on a target (i.e., master disk 2).

Incidentally, by applying a predetermined voltage to the deflection electrode (which is denoted by the reference character "1f"), it is possible to adjust the electron beam in position and in operation, for example such as in scanning.

Further, a drive unit for carrying and driving the master disk 2 will be described with reference to FIG. 2. As shown in FIG. 2, in the drive unit, a base 6 is provided with a pair of projecting support rails 6a on which a traveling stage 5 is slidably mounted. Supported on the traveling stage 5 is a spindle motor 4a of a hydraulic bearing type. Fixedly mounted on an upper end of a spindle of the motor 4a is a turn table 4 which is rotatably driven with torque supplied from a drive source. The drive source is constructed of an oil jet 3a ejected at high speed from an oil nozzle 3 which is also supported on the traveling stage 5. The oil jet 3a is tangentially directed against an outer peripheral surface of the turn table 4 to hit the same in the surface so that the turn table 4 is rotatably driven by the oil jet 3a.

On the other hand, threadably connected with a lower portion of the traveling stage 5 is a screw member 8 which is rotatably driven by a drive motor 7 to have the traveling stage 5 and the master disk 2 thereon moved along the support rails 6a.

By the above combination of necessary components such as the lens barrel and the drive unit comprising the turn table and the like, it is possible to record information on the master disk. In this case, since it is not desirable to transmit the electron beam through media other than a vacuum, these components are contained in a vacuum chamber to operate therein.

However, the conventional information recording apparatus having the above construction suffers from the following problems. As described above, since the system employs the oil jet as a means for producing torque, there is a fear that the vacuum chamber has its interior contaminated with oils, the oils being evaporated and adhering to the lens barrel of the electron microscope so as to impair its function.

As for the turn table, its torque produced by the use of the oil jet largely depends on the oil's properties such as its jet velocity, temperature, viscosity and the like. Further, a predetermined time lag is involved before the turn table (which has its outer peripheral surface subjected to the oil jet to receive the torque) reaches a predetermined rotational speed. In addition, such predetermined time lag is involved also when the turn table stops its rotational operation after the oil jet stops. Due to the presence of above-mentioned disadvantages, the system employing the oil jet is poor in responsivity and in controllability, and, therefore is not desirable to drive the master disk.

SUMMARY OF THE INVENTION

It is an object of the present invention to provide an information recording apparatus in which: a turn table carrying a master disk is improved in responsivity in its rotating and stopping operations; and, by producing a predetermined electron beam in a proper atmosphere, it is ensured that information is precisely and efficiently recorded on the master disk.

The above object is accomplished by providing an information recording apparatus comprising:
- a rotatably-driving means for rotatably driving an information-recording medium's master disk;
- an irradiation means for having an electron beam irradiate a recording surface of the information-recording medium's master disk;
- a movement means for producing, between the information-recording medium's master disk and the irradiation means, a relative movement in a direction parallel to the recording surface of the information-recording medium's master disk;
- a vacuum-atmosphere producing means for having all the rotatably-driving means, the irradiation means and the movement means disposed in a vacuum atmosphere;
- the rotatably-driving means being constructed of a turn table for carrying the information-recording medium's master disk, a spindle for supporting the turn table, an electric motor for rotatably driving the spindle; and a magnetic shield means for preventing magnetic fields of the electric motor from leaking outward.

In the information recording apparatus of the present invention, when the information is recorded on an information-recording medium's master disk, the master disk is first mounted on the turn table, and an electron beam emitted from an electron-beam irradiating means irradiates a surface of the master disk to form pits thereon.

In this case, since an electric motor serving as a drive means for imparting its torque to the turn table produces its torque electromagnetically, magnetic fields are produced in the vicinity of the motor due to its magnets and solenoid. Such magnetic fields affects the electron beam in properties such as its orientation and the like, which impairs the precision of the information recording.

Consequently, in order to prevent the magnetic fields from affecting the electron beam, the motor is enclosed in the magnetic shield means to have the electron beam be free from the magnetic fields, which makes it possible to perform the desired recording of information with high accuracy.

Further, the use of the electromagnetically energized motor as the drive source makes it easier to control (i.e., rotate and stop) the turn table in operation only by turning on and off an electric power source of the motor.

DESCRIPTION OF THE PREFERRED EMBODIMENTS

Hereinbelow, embodiments of an information recording apparatus of the present invention will be described in detail with reference to the drawings.

Figure 1:
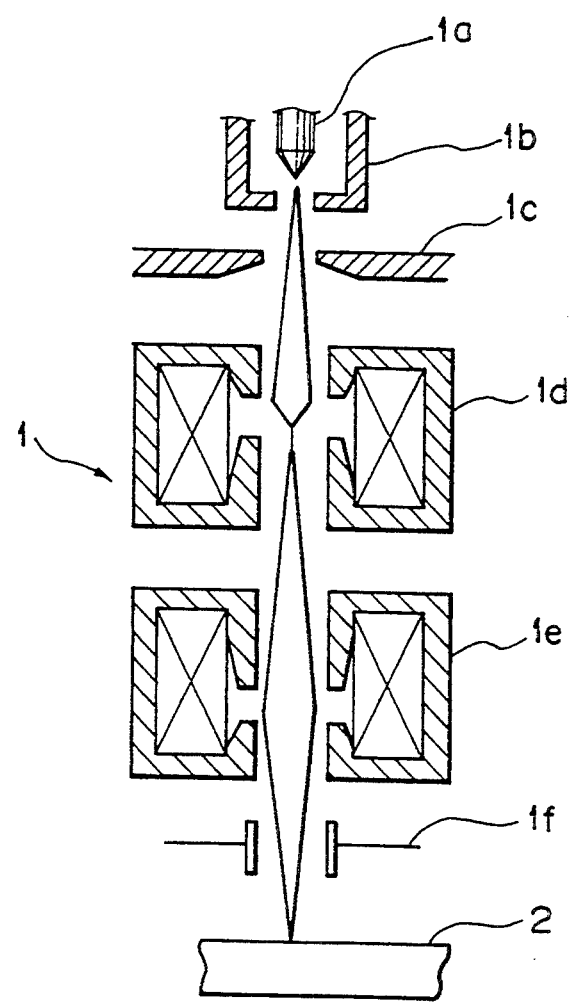
FIG. 1 is a schematic longitudinal sectional view of an electron-beam lens barrel through which an electron beam irradiates an optical-disk's master disk to record information thereon.
Figure 2:
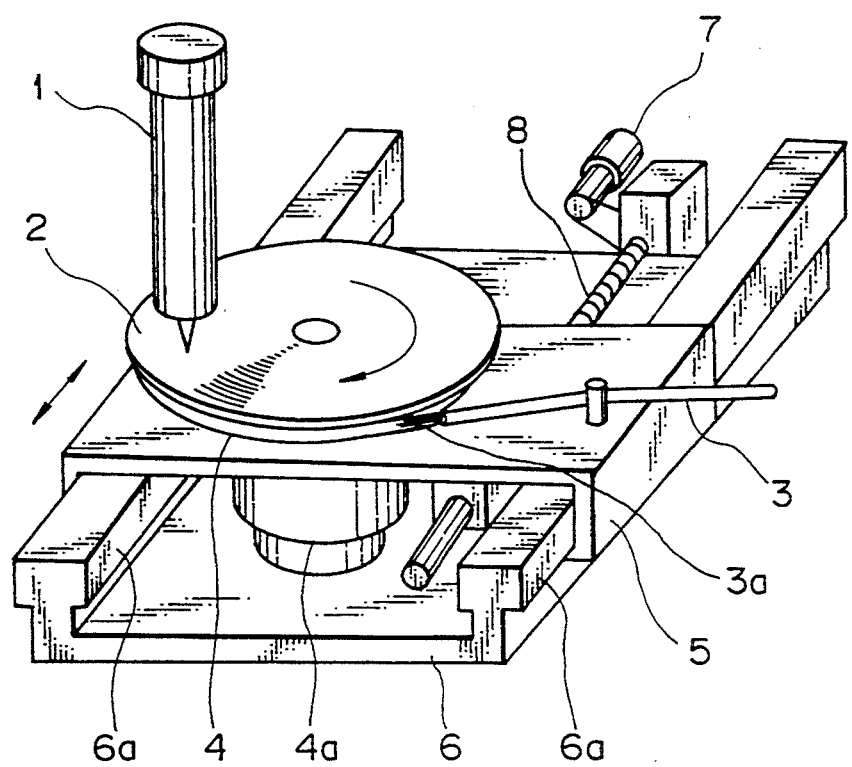
FIG. 2 is a schematic perspective view of the conventional information recording system.
Figure 3:
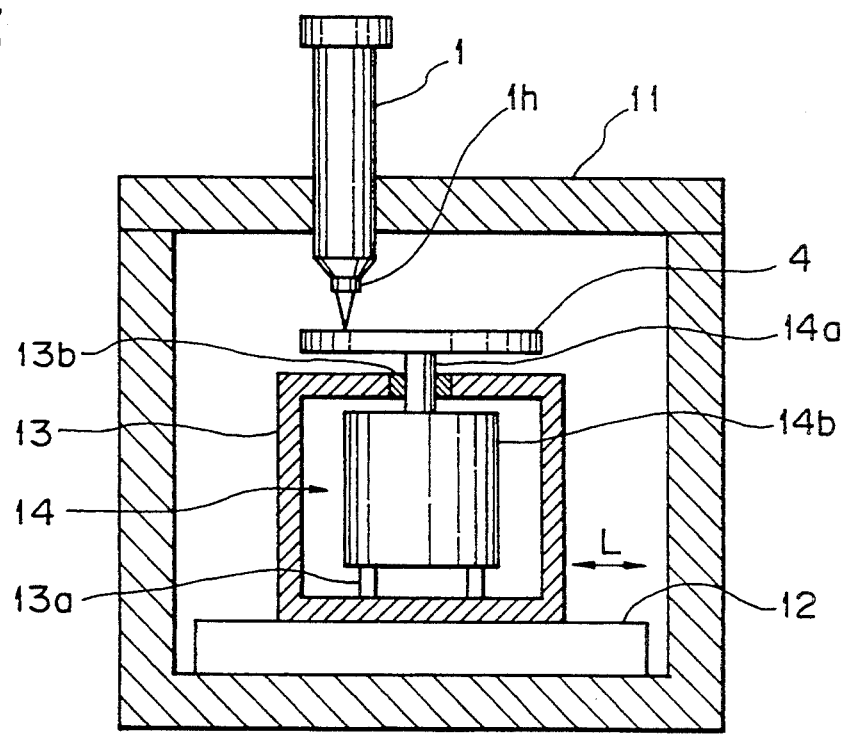
FIG. 3 is a schematic sectional view of an embodiment of the information recording system of the present invention.

An embodiment of the present invention shown in FIG. 3 has a construction in which: in the interior of a vacuum container 11 serving as a vacuum-atmosphere producing means, there is provided a rotatably-driving means for rotatably driving an optical-disk's master disk. In this rotatably-driving means: a body portion 14b of an electromagnetically energizing electric motor 14 is enclosed in a magnetic casing 13; a spindle 14a of the motor 14 passes through a hermetically-sealing member 13b to have its upper end extend upward beyond the casing 13; a turn table 4 for carrying a master disk is fixedly mounted on the thus extended upper end of the spindle 14a.

Incidentally, the electric motor 14 is rigidly supported by a predetermined support means 13a in the magnetic casing 13.

On the other hand, disposed over the turn table 4 is an electron-beam lens barrel 1 serving as an electron-beam irradiating means which is oppositely disposed from a principal surface of the turn table 4 to have at least its output orifice 1h of the electron beam mounted rigidly on the body of the vacuum container 11 in the interior thereof.

Further, the magnetic casing 13 in which the electric motor 14 is enclosed is supported by a movement (i.e., traveling) means 12, and, therefore movable in a direction L. In other words, the turn table 4 is movable in a direction parallel to its principal surface.

Incidentally, the movement means 12 used herein may be any suitable means such as a conventional screw mechanism, provided that the means may smoothly move the turn table without adversely affecting the electron beam.

In this embodiment of the present invention, the movement means 12 is used to move the turn table 4, and, therefore to move the optical-disk's master disk. The optical disk serves as an information recording medium. In the embodiment, it is also possible to use a movement means for moving the electron-beam irradiating means relative to the turn table 4. Namely, such movement means may be any other suitable means for producing a relative movement between the optical-disk's master disk and the electron-beam irradiating means in a tracking direction during the information recording operation.

As described above, the rotatably-driving means for rotatably driving the optical-disk's master disk is constructed of: the turn table 4 for carrying the optical-disk's master disk thereon; the spindle 14a for supporting the turn table 4; the body 14b of the electric motor 14 for rotatably driving the spindle 14a thereof; and, the magnetic casing 13 for preventing the magnetic fields of the electric motor 14 from leaking outward.

Now, a process for manufacturing the optical-disk's master disk will be described with reference to the information recording apparatus of the present invention, the system being constructed of the rotatably-driving means, the electron-beam irradiating means and the like.

First, the master disk on which information is recorded is inserted into the vacuum container 11 through a predetermined opening/closing door (not shown) of the container 11, and mounted on the turn table 4 in the container.

Then, an electric power switch (not shown) of the motor 14 is turned on to energize solenoids (not shown) of the motor 14 with electric currents, so that a electromagnetic force is produced. The thus produced force is used to rotate the spindle of the motor 14 and also used to rotate the turn table 4.

After that, while the magnetic casing 13 in which the motor 14 is enclosed is moved by the use of the movement means 12 in a direction parallel to the principal surface of the turn table 4, an electron beam corresponding to signals to be recorded is outputted from the electron-beam lens barrel 1 to irradiate the surface of the master disk mounted on the turn table 4.

As a result, pits corresponding to the information to be recorded on the surface of the master disk are formed into a spiral pattern.

In such process, since the motor 14 is enclosed in the magnetic casing 13, there is no fear that the magnetic fields of the motor 14 affect the electron beam, which makes it possible to perform the information recording with high accuracy.

Although the above description of the present invention is made on the premise that the spindle 14a is directly supported by a mechanical bearing (which is provided in the body 14a of the motor 14) through greases and like lubricants, it is also possible to use a pneumatic bearing in place of the mechanical bearing, which reduces a frictional resistance of the bearing to improve the turn table 4 in responsivity during the information recording.

Figure 4:
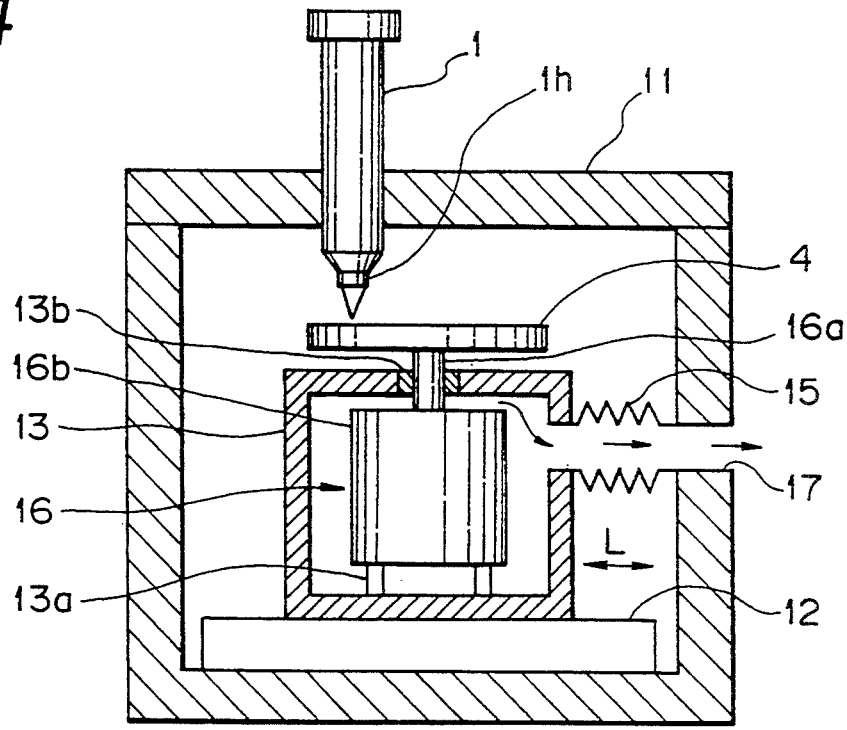
FIG. 4 is a schematic sectional view of another embodiment of the present invention.

Consequently, now, with reference to FIG. 4, another embodiment of the present invention will be described, the embodiment using the pneumatic bearing to support its spindle. A schematic sectional view of the embodiment is shown in FIG. 4. Incidentally, in the drawings, like reference numerals and characters apply to similar parts throughout the drawings, particularly in FIGS. 3 and 4. As shown in FIG. 4, the motor 16 provided with the pneumatic bearing is housed in the magnetic casing 13 which has its side surface connected with an end portion of a telescopic connecting pipe 15. The other end portion of the connecting pipe 15 is connected with an opening portion 17 of the vacuum container 11.

Through such connecting pipe 15, the interior of the magnetic casing 13 is in communication with the atmosphere.

Now, the motor 16 provided with the pneumatic bearing will be described. Although the motor 16 is electromagnetically driven as is in the motor 14 shown in FIG. 3, the spindle 16a of the motor 16 is supported in position by a static pneumatic pressure. The static pneumatic pressure is produced by allowing the air to pass through a minute clearance between the outer peripheral surface of the spindle 16a and the pneumatic bearing portion of the body of the motor 16. Consequently, it is possible for the motor 16 to considerably reduce its frictional resistance to such an extent that the frictional resistance substantially consists of only the viscous resistance of air. In this respect, the embodiment of the present invention shown in FIG. 4 is preferable since a load to which the motor 16 delivers its torque is small.

However, in the embodiment of the present invention shown in FIG. 4, the air leaks from the clearance of the bearing portion of the motor 16, and, therefore it is necessary to discharge the thus leaked air to the atmosphere. Consequently, to satisfy this necessity, the connecting pipe 15 is provided to permit the thus leaked air to be discharged to the atmosphere.

Further, since the connecting pipe 15 assumes a telescopic bellows-like shape, it is possible for the turn table 4 to move in a direction parallel to its principal surface relative to the vacuum container 11 when the movement means 12 is operated.

As described above, in the information recording apparatus of the present invention, the electromagnetically-energized motor is used as the driving means of the turn table carrying the master disk. In addition, the body of the motor is enclosed in the magnetic shield made of magnetic materials, which makes it possible to prevent the electron beam from being affected by the magnetic fields of the magnets and the solenoids of the motor, whereby the information is recorded on the master disk with high accuracy.

In addition, in the present invention, since the electromagnetic forces are used in place of the conventional oil jets as the drive source, it is possible to control the turn table in operation in an easy manner by simply turning off and on the electric power source of the motor, which improves the turn table in responsibility in operation.

Furthermore, in the system of the present invention, in contrast with the conventional case, there is no fear that the vacuum container is contaminated with oils, which enables the electron beam to perform the information recording with high accuracy.

Further, in the present invention: as the drive source, the electromagnetically-energized motor provided with the pneumatic bearing is used; and, the air-discharging means for discharging the air (which leaks in the magnetic casing) to the atmosphere; whereby a load to be driven in the system of the present invention is extremely reduced, and, therefore an electric power consumption of the system is also reduced while the leaked air can be discharged to the atmosphere, which makes it possible to perform the information recording of the master disk without involving any troubles.

What is claimed is:

1. An information recording apparatus comprising:
   an enclosure means for enclosing the information recording apparatus adapted to support a vacuum inside the enclosure means;
   means for rotatably driving an information-recording disk disposed inside said enclosure means;
   an irradiation means for having an electron beam irradiate a recording surface of said information-recording disk disposed inside said enclosure means;
   a movement means for producing, between said information-recording disk and said irradiation means, a relative movement in a direction parallel to said recording surface of said information-recording disk disposed inside said enclosure means;
   said driving means comprising a turn table for carrying said information-recording disk, a spindle for supporting said turn table, an electric motor for rotatably driving said spindle, and a magnetic shield means for preventing magnetic fields of said electric motor from leaking outward, said turn table, said spindle, said electric motor, and said magnetic shield means all disposed within said enclosure means.

2. The information recording apparatus as set forth in claim 1, wherein said magnetic shield means is constructed of a magnetic casing which has a clearance between itself and said spindle and encloses said electric motor, said clearance being hermetically sealed.

3. The information recording apparatus as set forth in claim 1, wherein said magnetic shield means encloses said electric motor, and said spindle extends through said magnetic shield means.

4. The information recording apparatus as set forth in claim 1, wherein said movement means comprises a driving motor and a screw.

5. The information recording apparatus as set forth in claim 1, wherein said magnetic shield means defines an aperture to provide atmospheric pressure to the interior of said magnetic shield means.

* * * * *